(12) United States Patent
Moon

(10) Patent No.: US 6,972,702 B1
(45) Date of Patent: Dec. 6, 2005

(54) 1-OF-N A/D CONVERTER

(75) Inventor: Jeong-Sun Moon, Moorpark, CA (US)

(73) Assignee: HRL Laboratories, LLC, Malibu, CA (US)

(*) Notice: Subject to any disclaimer, the term of this patent is extended or adjusted under 35 U.S.C. 154(b) by 18 days.

(21) Appl. No.: 10/869,014

(22) Filed: Jun. 15, 2004

(51) Int. Cl.[7] .................................. H03M 1/00
(52) U.S. Cl. ..................... 341/133; 341/150
(58) Field of Search ................ 341/133, 155, 341/158; 257/321; 327/528

(56) References Cited

U.S. PATENT DOCUMENTS

| | | | |
|---|---|---|---|
| 4,868,418 A | 9/1989 | Imamura et al. ............. | 307/362 |
| 4,872,010 A | 10/1989 | Larson et al. ................ | 341/134 |
| 5,140,188 A | 8/1992 | Burns .......................... | 307/362 |
| 5,247,298 A | 9/1993 | Wei et al. .................... | 341/133 |
| 5,867,116 A * | 2/1999 | Nakamura et al. .......... | 341/159 |
| 5,901,172 A * | 5/1999 | Fontana et al. .............. | 375/130 |
| 5,929,799 A * | 7/1999 | Rothenberg .................. | 341/156 |
| 6,111,288 A * | 8/2000 | Watanabe et al. ........... | 257/321 |
| 6,157,220 A | 12/2000 | Broekaert ..................... | 327/65 |
| 6,188,346 B1 | 2/2001 | Waho et al. .................. | 341/156 |
| 6,208,277 B1 | 3/2001 | Hellums et al. ............. | 341/133 |
| 6,288,658 B1 * | 9/2001 | Mestdagh et al. ........... | 341/118 |
| 6,348,887 B1 | 2/2002 | Broekaert .................... | 341/155 |
| 6,380,881 B2 * | 4/2002 | Harada et al. ............... | 341/165 |
| 6,456,214 B1 | 9/2002 | van der Wagt ............. | 341/133 |
| 6,480,134 B1 * | 11/2002 | Sasaki ......................... | 341/159 |
| 6,504,500 B1 * | 1/2003 | Tsukamoto .................. | 341/155 |
| 6,741,194 B1 * | 5/2004 | Cassagnes et al. .......... | 341/118 |
| 6,864,820 B2 * | 3/2005 | Nakamura et al. .......... | 341/155 |
| 2004/0233090 A1 * | 11/2004 | Miyashita et al. .......... | 341/155 |

OTHER PUBLICATIONS

U.S. Appl. No. 10/746,620, filed Dec. 23, 2003, Moon.
Lee, D., et al., "Fat Tree Encoder Design For Ultra-High Speed Flash A/D Converters," *IEEE Low Power Electronics Design*, pp. II-87-II-90 (2002) no month.
Moon, J.S., et al., "Unipolar Complementary Circuits Using Double Electron Layer Tunneling Transistors," *Applied Physics Letters*, vol. 74, No. 2, pp. 314-316 (Jan. 11, 1999).
Silburt, A.L., et al., "A Novel Multiple Threshold MOSFET Structure for A/D and D/A Coversion." *IEEE Journal of Solid-State Circuits*, vol. SC-19, No. 5, pp. 794-802 (Oct. 1984).
Waho, T., et al., "Flash Analog-to-Digital Converter Using Resonant-Tunneling Multiple-Valued Circuits," IEEE, IEDM, pp. 94-99 (2001) no month.

* cited by examiner

*Primary Examiner*—Peguy JeanPierre
(74) *Attorney, Agent, or Firm*—Ladas & Parry LLP

(57) ABSTRACT

A flash analog-to-digital converter (ADC). Each comparator of the flash ADC has an OFF-ON-OFF transfer function. For each analog value to be converted, only one comparator is in the ON condition, and the other comparators are in the OFF condition. In this way, the average power consumption of the flash ADC is much less than the average power consumption of prior similar devices.

17 Claims, 6 Drawing Sheets

1-OF-N A/D CONVERTER

BACKGROUND

1. Field

The present invention relates to analog-to-digital converters (ADCs). In particular, it relates to a flash ADC.

2. Related Prior Art

ADCs are a critical building block in numerous system applications dealing with extracting information from a continuously varying electromagnetic spectrum. The success of ADCs over the past two decades includes enhanced performance in high-resolution imaging, phase-array radar, and terrestrial and satellite surveillance and communication. However, ADC technology based on conventional devices has been limited to incremental advances, with a historical improvement of only 1.5 bits for any given sampling rate over the last eight years. In particular, current ADC performance measured by the resolution sampling rate is approximately four orders of magnitude less than the maximum sampling rate limitation of the Heisenberg (quantum) uncertainty principle.

Additionally, the highest performing ADCs also dissipate the highest amount of power. For example, a 3-bit flash ADC fabricated with InP HBT technology having a sampling rate of 18 GS/s (i.e. GigaSamples per second), dissipates 4.25 W. On the other hand, Si CMOS-based ADCs offer high resolution and relatively high power efficiency, but run at much lower sampling rates, i.e. MS/s instead of GS/s.

Comparators used for signal quantization are the primary bottleneck in terms of speed and power dissipation in existing ADCs.

Reference will be made to a prior art example of parallel ADCs. Parallel ADCs are well known in the art. Those converters are also known as simultaneous or "flash" converters. A parallel bank of voltage comparators is used, where each comparator is responsive to the analog voltage attaining a predetermined voltage level. In particular, a maximum analog voltage is divided into $2^N$ voltage levels. Each level represents a quantum of voltage and is represented by one of the digital output states. The digital output is a N-bit output and each comparator is associated with a determined quantum level. Each comparator operates with a threshold voltage. The first (highest) comparator will have a high threshold voltage, the second comparator will have a threshold voltage which is lower than the threshold voltage of the first comparator, the third comparator will have a threshold voltage which is lower than the threshold voltage of the second comparator and so on. The last (lowest) comparator will have the lowest threshold voltage.

The arrangement described above is shown in FIG. 1, where an input analog voltage $V_{IN}$ is converted into a three-bit output digital voltage $Y_2Y_1Y_0$ by means of a parallel bank of voltage comparators $VC_1 \ldots VC_7$. The positive input of each comparator $VC_1 \ldots VC_7$ is the input analog voltage $V_{IN}$. The negative input or threshold voltage of each comparator $VC_1 \ldots VC_7$ varies according to the comparator. Comparator $VC_7$ has the highest threshold voltage $[(2^N-1)/2^N]V$ i.e. 7/8 V, and comparator $VC_1$ has the lowest threshold voltage $\{[2^N-(2^N-1)+1]/2^N\}V=2/2^NV$, i.e. 1/8 V. If the input analog voltage $V_{IN}$ is greater than 7/8 V, all outputs $Q_1 \ldots Q_7$ of comparators $VC_1 \ldots VC_7$ will have a logic high value, because in each comparator the positive input will be higher than the negative input. If the input analog voltage $V_{IN}$ is greater than 6/8 V but less than 7/8 V, the output $Q_7$ of comparator $VC_7$ will have a logic low value and the outputs $Q_1 \ldots Q_6$ of comparators $VC_1 \ldots VC_6$ will have a logic high value, and so on. If, for example, the input analog voltage $V_{IN}$ is less than 1/8 V, all outputs $Q_1 \ldots Q_7$ will have a logic low value. The logic high or low values $Q_1 \ldots Q_7$ are sent to an encoder E which, in turn, provides the three-bit output digital voltage $Y_2Y_1Y_0$. The kind of conversion logic employed by the encoder E is well known to the person skilled in the art and will not be discussed here in detail.

The higher the number of comparators, the lower the value of the voltage $\Delta$ that can be converted. The above example of FIG. 1 shows a $\Delta=1/8$ V. In case of N=16, i.e. 15 voltage comparators, $\Delta=1/16$ V. Therefore, the higher the number of comparators, the higher the precision of the converter. The person skilled in the art will also appreciate that the $2^N-1$ binary data signals $Q_1-Q_{2^N-1}$ output by the voltage comparators $VC_1-VC_{2^N-1}$ are in the form of a "thermometer code" as shown in the following Table 1.

TABLE 1

| $V_{IN}$ | $Q_1$ | $Q_2$ | $Q_3$ | $\ldots$ | $Q_{2-1}^N$ |
|---|---|---|---|---|---|
| $V_{IN} > (1 - \Delta)V$ | 1 | 1 | 1 | 1 | 1 |
| $(1 - 2\Delta)V < V_{IN} < (1 - \Delta)V$ | 0 | 1 | 1 | 1 | 1 |
| $(1 - 3\Delta)V < V_{IN} < (1 - 2\Delta)V$ | 0 | 0 | 1 | 1 | 1 |
| $\ldots$ | 0 | 0 | 0 | $\ldots$ | 1 |
| $0 < V_{IN} < [1 - (2^N - 1)\Delta]V$ | 0 | 0 | 0 | 0 | 1 |

The main disadvantage of the simultaneous conversion method discussed above is not the high number of comparators used, but instead the average dissipated power due to the high number of voltage comparators which have to assert a high logic value at their output. The person skilled in the art will notice that the average number of voltage comparators which have to assert a high logic value at their outputs in the "thermometer code" prior art scenario is half the number of the voltage comparators used, i.e. $(2^N-1)/2$. It follows that the average dissipated power is proportional to that number, thus growing exponentially as resolution increases.

Therefore, there is a need for a new kind of ADC which maintains the advantages of simultaneous ADCs and dissipates less power.

SUMMARY

According to a first aspect of the present disclosure, an analog-to-digital converter (ADC) is disclosed comprising: a plurality of decision circuits, each decision circuit having a common analog signal input, an output, a low threshold and a high threshold, the output being indicative of a first logic value if the input is lower than the low threshold and higher than the high threshold, the output being indicative of a second logic value, different from the first logic value, if the input is higher than the low threshold and lower than the high threshold, wherein, for each value of the common analog signal, only one decision circuit of the plurality of decision circuits has an output indicative of the second logic value, the other decision circuits of the plurality of decision circuits having an output indicative of the first logic value.

According to a second aspect, a comparator is disclosed comprising: a first input signal node to which an analog input signal is applied; a second input signal node to which a first voltage value is applied; a third input signal node to which a second voltage value, higher than the first voltage value, is applied; and an output signal node providing a signal indicative of a first logic value when the analog input signal has a value lower than the first voltage value or higher than the second voltage value, and providing a signal indicative of a second logic value, different from the first logic value, when the analog input signal has a value higher than the first voltage value and lower than the second voltage value.

According to a third aspect, an analog-to-digital converter (ADC) is disclosed comprising: a plurality of comparators having monotonically increasing transition levels, each comparator including a tunneling coupled transistor (TCT) having a first quantum well, a tunneling region, and a second quantum well; input means for providing an analog input signal simultaneously to each comparator; each TCT having a different threshold level due to different concentrations of carriers in the first quantum well and second quantum well; and an encoder coupled to outputs of each comparator of the plurality of comparators for generating a digital output signal as a function of the outputs of the comparators, wherein, for each value of the analog input signal, tunneling occurs in one TCT of the plurality of comparators and tunneling does not occur in the remaining TCTs of the plurality of comparators.

BRIEF DESCRIPTION OF THE DRAWINGS

The present invention will be understood and appreciated more fully from the following detailed description taken in conjunction with the drawings in which.

DETAILED DESCRIPTION

Prior art comparators for use in a flash ADC work with a single threshold voltage applied to the negative input of each comparator. FIG. 2A illustrates this concept by showing one of the comparators VC of the previous FIG. 1. The input signal $V_{IN}$ is applied to the positive input of the comparator, and a single threshold value $V_T$, different from comparator to comparator, is applied to the negative input of the comparator. FIG. 2B shows the functional relation between the input VN and the output $V_{OUT}$ of the comparator VC. As long as $V_{IN}$ has a value which is lower than $V_T$, the output $V_{OUT}$ has a low logic value. As soon as $V_{IN}$ has a value which is higher than $V_T$, the output $V_{OUT}$ has a high logic value.

Figure 3A:
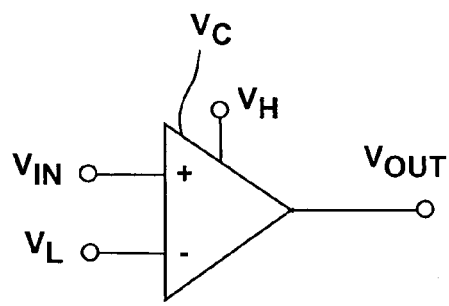
FIG. 3A shows a comparator to be used in accordance with the present disclosure.
Figure 3B:
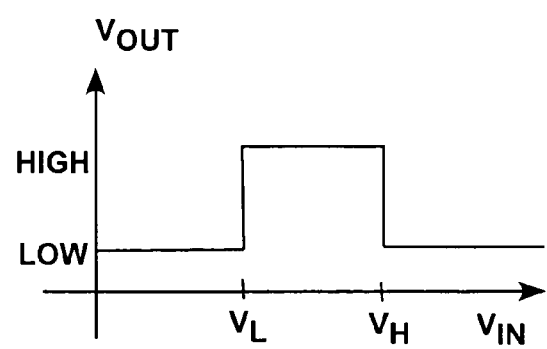
FIG. 3B shows the input-output transfer function of the comparator of FIG. 3A.

FIGS. 3A and 3B show the kind of comparator used in the present disclosure. As shown in FIG. 3A, the comparator for use in accordance with the present disclosure has an additional high-threshold $V_H$, which allows the input $V_{IN}$ to be asserted at the output only when $V_{IN}$ is less than $V_H$. In particular, FIG. 3B shows the functional relation between the input $V_{IN}$ and the output $V_{OUT}$ of the comparator VC to be used in accordance with the present disclosure. The output $V_{OUT}$ is high when $V_L < V_{IN} < V_H$ and is low when $V_{IN} < V_L$ or $V_{IN} > V_H$.

Figure 1:
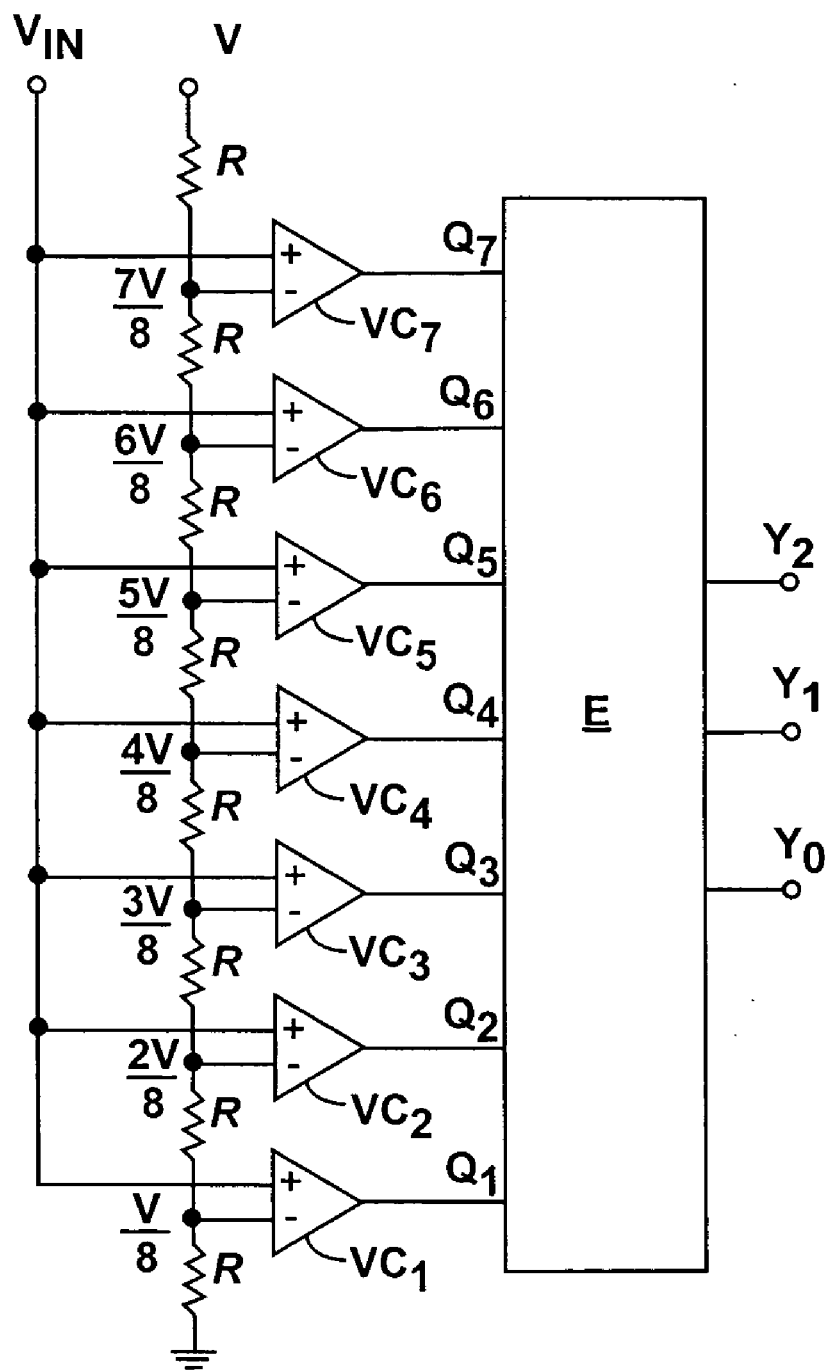
FIG. 1 shows a prior art flash ADC.
Figure 2A:
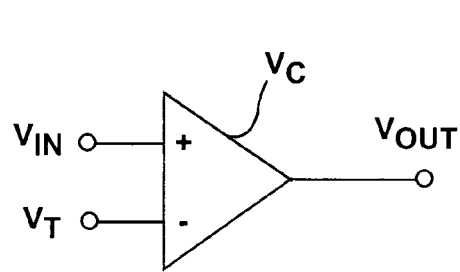
FIG. 2A shows a comparator used in the prior art flash ADC of FIG. 1.
Figure 2B:
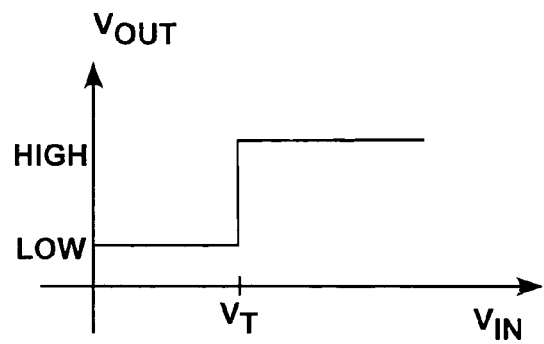
FIG. 2B shows the input-output transfer function of the comparator of FIG. 2A.
Figure 4:
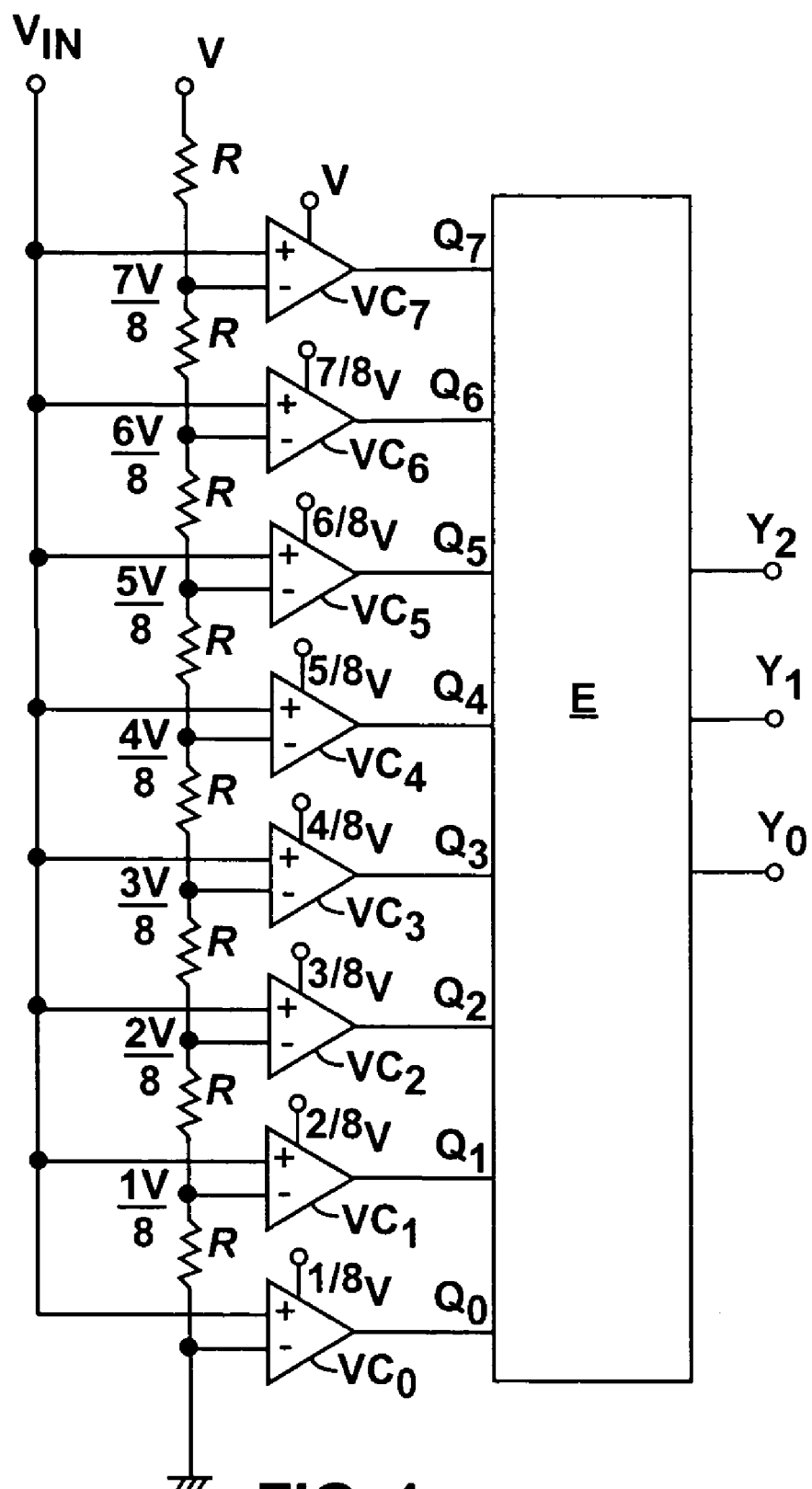
FIG. 4 shows a flash ADC using comparators as disclosed in FIGS. 3A and 3B.

FIG. 4 shows an 8-comparator arrangement of a flash ADC similar to that of FIG. 1, where each comparator is in accordance with the embodiment disclosed in FIGS. 3A and 3B. Differently from the prior art shown in FIG. 1, in the flash ADC according to the present disclosure, for any value of the input voltage $V_{IN}$ only one comparator VC has to assert a high logic value at its output.

In the embodiment shown in FIG. 4, the positive input of each comparator or decision circuit $VC_0 \ldots VC_7$ is the input analog voltage $V_{IN}$. The negative input or low-threshold voltage of each comparator $VC_0 \ldots VC_7$ varies according to the comparator. Comparator $VC_7$ has the highest low-threshold voltage $[(2^N-1)/2^N]V$ i.e. 7/8 V, and comparator $VC_0$ has the lowest low-threshold voltage $\{[2^N-(2^N)]/2^N\}V$, i.e. 0 V. Additionally, each comparator $VC_0 \ldots VC_7$ also has a high-threshold voltage, in accordance with the embodiment shown in FIGS. 3A and 3B. Comparator $VC_7$ has the highest high-threshold voltage $(2^N-0/2^N)V$ i.e. V, and comparator $VC_0$ has the lowest high-threshold voltage $\{[2^N-(2^N)+1]/2^N\}V=2/2^NV$, i.e. 1/8 V. If the input analog voltage $V_{IN}$ is greater than 7/8 V and less than V, only output $Q_7$ will have a logic high value, because the value of the input analog voltage will be between the high-threshold voltage and the low-threshold voltage of comparator $VC_7$, i.e. V and 7/8 V, respectively. The outputs $Q_0$–$Q_6$ of the remaining comparators $VC_0 \ldots VC_6$ will all be at a low logic value, because for each of them the positive input $V_{IN}$ will be higher than their high-threshold value. If the input analog voltage VN is greater than 6/8 V but less than 7/8 V, the output $Q_7$ of comparator $VC_7$ will have a logic low value. However, the output $Q_6$ of comparator $VC_6$ will have a logic high value, because the value of the input analog voltage will be between the high-threshold voltage and the low-threshold voltage of comparator $VC_6$, i.e. 7/8 V and 6/8 V, respectively. The outputs $Q_0 \ldots Q_5$ of the remaining comparators $VC_0 \ldots VC_5$ will all be at a low logic value, because for each of them the positive input $V_{IN}$ will be higher than their high-threshold value, and so on. The logic high or low values $Q_0 \ldots Q_7$ are sent to the encoder E which, in turn, provides the three-bit output digital voltage $Y_2Y_1Y_0$. The kind of conversion logic employed by the encoder E, although different from the logic employed in the embodiment of FIG. 1, is well known to the person skilled in the art and will not be discussed here in detail. Additionally, latching means may be provided, to correctly pipeline the inputs $Q_0 \ldots Q_7$ to the encoder E.

Also in this case, the higher the number of comparators, the lower the value of the voltage A that can be converted. The above example of FIG. 4 shows a $\Delta=1/8$ V. In case of N=16, i.e. 16 voltage comparators, $\Delta=1/16$ V. Therefore, the higher the number of comparators, the higher the precision of the converter. This time, the $2^N$ binary data signals $Q_0 - Q_{2^N-1}$ output by the voltage comparators $VC_0 \ldots VC_{2^N-1}$ are not in the form of a thermometer code. Instead, they are in the form of a "1-of-N" code (or "1-of-$2^N$" to follow the notation used so far), as shown in the following Table 2;

TABLE 2

| $V_{IN}$ | $Q_1$ | $Q_2$ | $Q_3$ | ... | $Q_{2-1}^N$ |
|---|---|---|---|---|---|
| $(1 - \Delta)V < V_{IN} < V$ | 1 | 0 | 0 | 0 | 0 |
| $(1 - 2\Delta)V < V_{IN} < (1 - \Delta)V$ | 0 | 1 | 0 | 0 | 0 |

TABLE 2-continued

| $V_{IN}$ | $Q_1$ | $Q_2$ | $Q_3$ | ... | $Q_{2-1}^N$ |
|---|---|---|---|---|---|
| $(1 - 3\Delta)V < V_{IN} < (1 - 2\Delta)V$ | 0 | 0 | 1 | 0 | 0 |
| ... | 0 | 0 | 0 | ... | 0 |
| $0 < V_{IN} < [1 - (2^N - 1)\Delta]V$ | 0 | 0 | 0 | 0 | 1 |

Therefore, according to the present disclosure, only one of the $2^N$ comparators has to assert a high voltage value at its output. It follows that the average power consumption of the flash ADC of the present disclosure will be much less than the average power consumption of the prior art ADC.

In the following, an embodiment of the flash ADC will be disclosed, which makes use of tunneling-coupled transistor (TCT) technology. TCTs are also known as double electron layer tunneling transistors (DELTT), or quantum-well transistors. A prior art TCT is, for example, disclosed in Linda Geppert, "Quantum Transistors: Toward Nanoelectronics", IEEE Spectrum, September 2000, pp. 46–51. A method to fabricate TCTs is disclosed in the application "Microelectronic Device Fabrication Method" by Jeong-Sun Moon, Ser. No. 10/746,620, filed on Dec. 23, 2003, the disclosure of which is incorporated herein by reference.

Figure 5A:
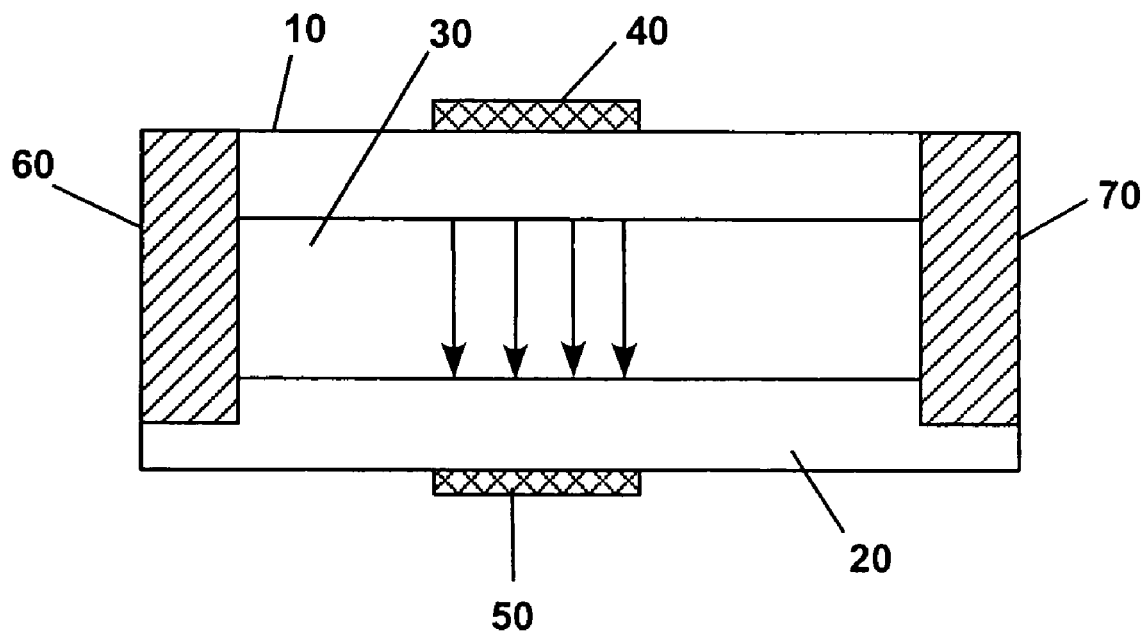
FIGS. 5A and 5B show an embodiment of a quantum well transistor.

A TCT is based on gate-control of interlayer tunneling between two separate two-dimension electron gas (2DEG) layers, independently connected to electrical contacts. FIG. 5A shows a TCT in cross-section. A first 2DEG layer 10 (top quantum well or source) has a carrier density of $n_1$. A second 2DEG layer 20 (bottom quantum well or drain) has a carrier density of $n_2$. FIG. 5A also discloses a barrier layer 30, a top control gate 40, a bottom control gate 50, and electrical contacts 60 and 70.

The wells 10, 20 are two-dimensional. In particular, the carriers are confined in a narrow quantum well (about 20 nm, for instance), not in a three-dimensional bulk. The two-dimensional aspect of the wells allows gate control of the threshold voltage. In operation, electrons tunnel from top quantum well 10 to bottom quantum well 20 through barrier layer 30. In III–V devices, the barrier layer can be, for example, InAlAs, AlGaN, AlGaAs, or AlSb. According to quantum mechanics principles, an electron can tunnel through the barrier 30 only if its energy and its momentum in the plane of the well are both conserved. Therefore, an electron can tunnel only if the energy state of the bottom quantum well is equal in energy and momentum to the state the electron occupies.

The interlayer tunneling requires external transduction in order to allow energy and momentum conservation. External transduction can either be electrical or optical. See, for example, J. S. Moon et al., "Unipolar Complementary Circuits Using Double Electron Layer Tunneling Transistors," Applied Physics Letters, Vol. 74, Issue 2, pp. 314–316 (1999). Assuming that the carrier density $n_1$ is greater than the carrier density $n_2$, the TCT usually is in an OFF-state, so that no current flows between its electrical contacts 60 and 70. In order to bring the TCT in an ON-state, the top control gate 40 is electrically excited by means of a negative pulsed voltage, which brings the carrier density $n_1$ of the first top quantum well layer 10 to a value which is equal to the value of the carrier density $n_2$ of the bottom quantum well layer 20, by switching on the quantum mechanical tunneling, as shown by arrows in FIG. 5A. As soon as the pulsed voltage becomes more negative than the initial negative pulsed voltage, the carrier density $n_1$ becomes inferior to the carrier density $n_2$, and the TCT is again in an OFF-state. Therefore, unlike conventional diode-based switches, which operate in an ON-OFF mode, TCTs operate in a unique OFF-ON-OFF mode, similar to the behavior shown in FIG. 3B, thus exhibiting a high-threshold and a low-threshold, and both polarities of device transconductance, even if the device is unipolar because the only carriers are electrons.

It should be noted that the carrier densities $n_1$ and $n_2$ can be controlled independently from each other by means of external gate bias, so that the presence of the additional back control gate 50 will enable control of the carrier density $n_2$ independently from carrier density $n_1$. In this way, it will be possible to control the magnitude of the electrical pulse at the top control gate to switch a TCT ON and OFF. As a consequence, it is possible to implement TCTs with a continuous electrically-tunable tunneling voltage.

Figure 5B:
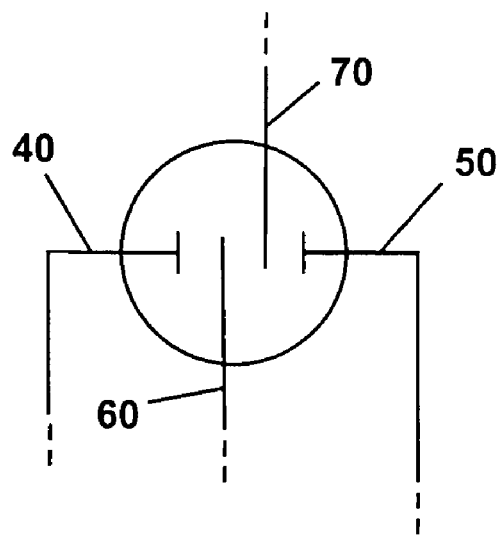

FIG. 5B shows a schematical circuital representation of the TCT shown in FIG. 5A.

Figure 6A:
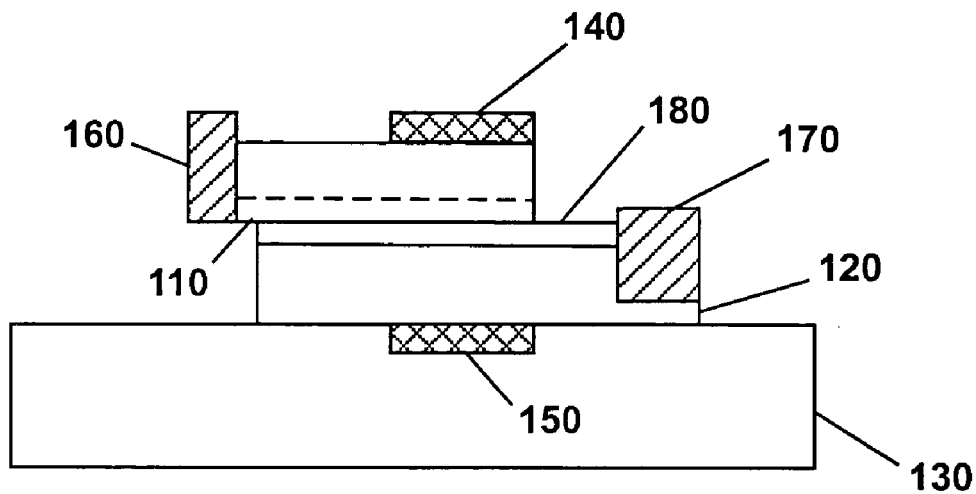
FIGS. 6A and 6B show further embodiments of a quantum well transistor.
Figure 6B:
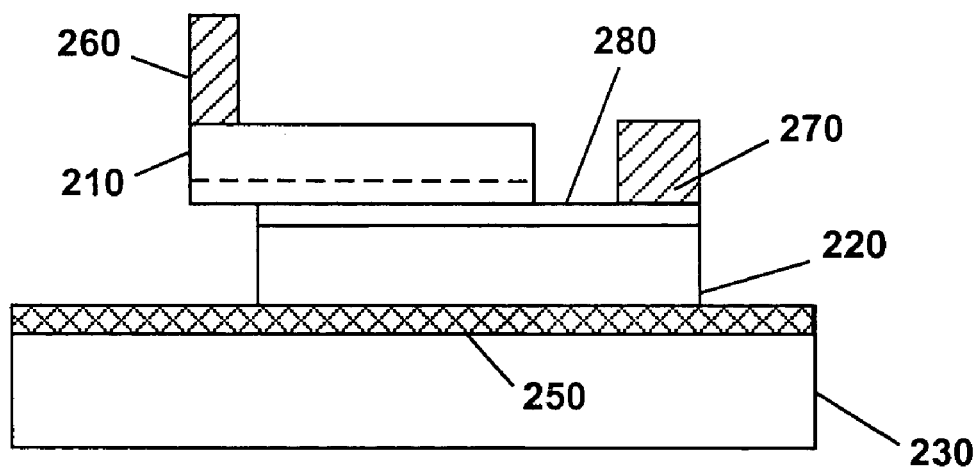

FIGS. 6A and 6B show two further embodiments of a TCT to be used in accordance with the present disclosure. Element 110/210 is a first channel or quantum well layer. Element 120/220 is a second channel or quantum well layer. The channel layers 110/210 and 120/220 may be formed from various semiconductors, such as doped or undoped InGaAs. Element 130/230 is a substrate on which the TCT is formed, for example an InP substrate. Element 150 is a control gate formed from a first barrier layer. Element 180 is a second barrier layer. The barrier layers may be formed, for example, of doped or undoped InP and InAlAs. Element 160/260 is a first metallic electrical contact, acting as a source electrode. Element 170/270 is a second metallic contact, acting as a drain electrode. Element 140 is a third metallic contact, acting as a gate electrode. The metallic contacts may be formed, for example, of n+ or Si doped InGaAs.

Figure 7:
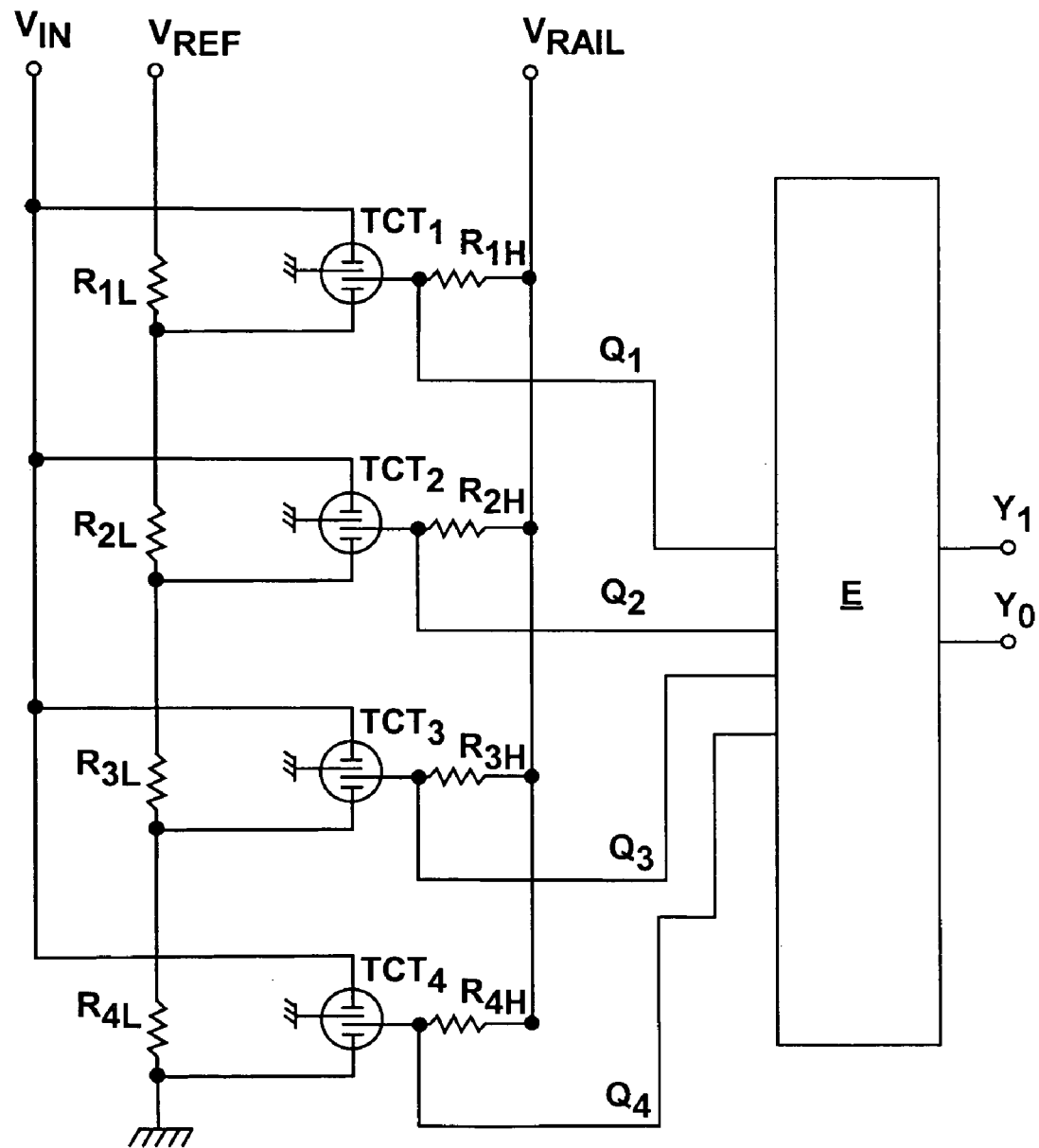
FIG. 7 shows a flash ADC using quantum well transistors of the type disclosed, for example, in FIG. 5A, 6A or 6B as comparators.

FIG. 7 shows a 2-bit flash ADC according to the present disclosure making use of TCT devices. Implementation of a 3-bit or more flash ADC will be straightforward. Each comparator stage n comprises a first resistor $R_{nL}$ forming a first voltage divider determining the low-threshold $V_L$ (see FIG. 3B) of the comparator and a second resistor $R_{nH}$ forming a second voltage divider determining the high-threshold $V_H$ (see FIG. 3B) of the comparator. For example, in the embodiment of FIG. 7, all values of the resistors can be the same. The reference voltage VREF is the voltage set to the individual comparator cells. The voltage VRAIL is the logic voltage. While VRAIL is a supply drain bias, VREF is a reference voltage which sets the threshold voltage to each TCT cell. Also in this case, latching means can be provided to correctly pipeline the inputs $Q_1 \ldots Q_4$ to the encoder E. The incoming analog signal $V_{IN}$ is simultaneously applied to all comparator stages, and compared with two threshold voltages in each comparator. Among the $2^N$ comparators in the flash ADC, only one comparator will be switched ON. The comparator output is not the usual thermometer code, and is instead a 1-of-N code.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

What is claimed is:

1. An analog-to-digital converter (ADC) comprising:
   a plurality of decision circuits, each decision circuit having a common analog signal input, an output, a low threshold and a high threshold, the output being indicative of a first logic value if the input is lower than the low threshold and higher than the high threshold, the output being indicative of a second logic value, different from the first logic value, if the input is higher than the low threshold and lower than the high threshold, wherein, for each value of the common analog signal, only one decision circuit of the plurality of decision circuits has an output indicative of the second logic value, the other decision circuits of the plurality of decision circuits having an output indicative of the first logic value.

2. The ADC of claim 1, wherein each decision circuit has a second input and a third input, the second input being a first analog signal value corresponding to the low threshold and the third input being a second analog signal value, different from the first analog signal value, corresponding to the high threshold.

3. The ADC of claim 1, wherein each decision circuit comprises a tunneling-coupled transistor (TCT).

4. The ADC of claim 3, wherein each TCT comprises a source terminal, a drain terminal, a first control gate, and a second control gate.

5. The ADC of claim 1; wherein the plurality of decision circuits are $2^N$ decision circuits, N being an integer equal to or greater than 1.

6. The ADC of claim 1, further comprising an encoder coupled to outputs of each decision circuit of the plurality of decision circuits for generating a digital output signal as a function of the outputs of the decision circuits.

7. The ADC of claim 6, wherein the digital output signal is a N-bit signal and the plurality of decision circuits are $2^N$ decision circuits.

8. A comparator comprising:
a first input signal node to which an analog input signal is applied;
a second input signal node to which a first voltage value is applied;
a third input signal node to which a second voltage value, higher than the first voltage value, is applied; and
an output signal node providing a signal indicative of a first logic value when the analog input signal has a value lower than the first voltage value or higher than the second voltage value, and providing a signal indicative of a second logic value, different from the first logic value, when the analog input signal has a value higher than the first voltage value and lower than the second voltage value.

9. An analog-to-digital converter (ADC) comprising a plurality of comparators according to claim 8.

10. The ADC of claim 9, wherein the first voltage value and the second voltage value of the comparators of the plurality of comparators are so chosen that the second voltage value of a first comparator corresponds to the first voltage value of a second comparator, the second voltage value of the second comparator corresponds to the first voltage value of a third comparator, and so on.

11. The ADC of claim 10, wherein each comparator comprises a tunneling-coupled transistor (TCT).

12. The ADC of claim 11, wherein each TCT comprises a source terminal, a drain terminal, a first control gate, and a second control gate.

13. An analog-to-digital converter (ADC) comprising:
a plurality of comparators having monotonically increasing transition levels, each comparator including a tunneling coupled transistor (TCT) having a first quantum well, a tunneling region, and a second quantum well;
input means for providing an analog input signal simultaneously to each comparator;
each TCT having a different threshold level due to different concentrations of carriers in the first quantum well and second quantum well; and
an encoder coupled to outputs of each comparator of the plurality of comparators for generating a digital output signal as a function of the outputs of the comparators, wherein, for each value of the analog input signal, tunneling occurs in one TCT of the plurality of comparators and tunneling does not occur in the remaining TCTs of the plurality of comparators.

14. The ADC of claim 13, wherein the threshold level of a particular TCT comprises a low threshold and a high threshold.

15. The ADC of claim 13, wherein the output of a particular TCT is indicative of a first logic value if tunneling occurs in the particular TCT and is indicative of a second logic value if tunneling does not occur in the particular TCT.

16. The ADC of claim 14, wherein the output of a particular TCT is indicative of a first logic value if the input to the particular TCT is between the low threshold and the high threshold of the particular TCT and the output of the particular TCT is indicative of a second logic value if the input to the particular TCT is not between the low threshold and the high threshold of the particular TCT.

17. The ADC of claim 14, wherein each comparator further includes a first resistor and a second resistor, the first resistor being part of a first voltage divider determining the low threshold, and the second resistor being part of a second voltage divider determining the high threshold.

* * * * *